United States Patent
Määttä et al.

(10) Patent No.: US 11,062,831 B2
(45) Date of Patent: *Jul. 13, 2021

(54) MAGNETIC BLOCK LOCKING OF AN ELECTRONIC DEVICE

(71) Applicant: Microsoft Technology Licensing, LLC, Redmond, WA (US)

(72) Inventors: Esa Määttä, Espoo (FI); Otto Huittinen, Espoo (FI); Juha Järvilinna, Perniö (FI); Ville Vehkaperä, Oulu (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 171 days.

This patent is subject to a terminal disclaimer.

(21) Appl. No.: 16/055,017

(22) Filed: Aug. 3, 2018

(65) Prior Publication Data
US 2019/0074120 A1    Mar. 7, 2019

Related U.S. Application Data

(63) Continuation of application No. 15/261,862, filed on Sep. 9, 2016, now Pat. No. 10,068,692.

(51) Int. Cl.
| | |
|---|---|
| *H01F 7/00* | (2006.01) |
| *H01F 7/02* | (2006.01) |
| *H05K 9/00* | (2006.01) |
| *H05K 5/02* | (2006.01) |
| *G06F 1/16* | (2006.01) |

(52) U.S. Cl.
CPC .............. *H01F 7/0205* (2013.01); *G06F 1/16* (2013.01); *G06F 1/1679* (2013.01); *H01F 7/0263* (2013.01); *H05K 5/0221* (2013.01); *H05K 9/0075* (2013.01)

(58) Field of Classification Search
CPC .......... H01F 7/02; H01F 7/0252; H05K 5/02; H05K 9/0075
USPC ........................................................ 335/219
See application file for complete search history.

(56) References Cited

U.S. PATENT DOCUMENTS

| | | | |
|---|---|---|---|
| 8,138,869 B1* | 3/2012 | Lauder ................. | G06F 1/1656 335/219 |
| 2014/0043121 A1* | 2/2014 | Sartee ................... | H01F 41/00 335/219 |

(Continued)

*Primary Examiner* — Shawki S Ismail
*Assistant Examiner* — Lisa N Homza

(57) ABSTRACT

An electronic device comprising a first portion and a second portion pivotably connected to each other is disclosed. The electronic device is pivotable between a closed position and an open position. The device comprises a magnetically attractable arrangement within or on the second portion and a magnetic arrangement comprising a magnet having a magnetic field and a magnetic shielding element disposed within or on the first portion. At least one of the magnet or the magnetic shielding element is configured to move translationally with respect to the other between a shielded position and an engaging position when the first portion is pivoted with respect to the second portion. In the shielded position, the magnetic shielding element at least partially reduces a portion of the magnetic field extending outside of the first portion. In the engaging position, the magnet engages the magnetically attractable arrangement.

20 Claims, 4 Drawing Sheets

(56) References Cited

U.S. PATENT DOCUMENTS

| | | | |
|---|---|---|---|
| 2014/0062629 A1* | 3/2014 | Ow | H05K 9/0075 335/285 |
| 2015/0049426 A1* | 2/2015 | Smith | G06F 1/1628 361/679.27 |
| 2016/0003269 A1* | 1/2016 | Russell-Clarke | A44B 17/0041 24/303 |
| 2017/0351297 A1* | 12/2017 | Kim | H05K 5/02 |
| 2018/0054905 A1* | 2/2018 | Maatta | H05K 9/0075 |
| 2018/0075957 A1* | 3/2018 | Maatta | G06F 1/16 |

* cited by examiner

MAGNETIC BLOCK LOCKING OF AN ELECTRONIC DEVICE

CROSS-REFERENCE TO RELATED APPLICATION

This application is a continuation of and claims priority to U.S. application Ser. No. 15/261,862, entitled "MAGNETIC BLOCK LOCKING OF AN ELECTRONIC DEVICE," filed Sep. 9, 2016, which is incorporated herein in its entirety.

BACKGROUND

Electronic devices may be available in foldable or pivotable form factors. In order to restrict the pivoting movement of two or more portions of such devices, locking of the portions in certain positions, for instance closed positions, may be desired.

Mechanical arrangements, such as dents or latches, may be used for locking such devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An electronic device is disclosed. The electronic device may comprise a first portion and a second portion, the first and second portion being pivotably connected to each other, the electronic device thereby being pivotable between a closed position and an open position. The electronic device may further comprise a magnetically attractable arrangement disposed within or on the second portion; a magnetic arrangement disposed within or on the first portion, the magnetic arrangement comprising a magnet having a magnetic field and a magnetic shielding element; wherein at least one of the magnet or the magnetic shielding element is configured to move translationally with respect to the other between a shielded position and an engaging position when the first portion is pivoted with respect to the second portion, so that in the closed position of the electronic device, the magnetic arrangement is in the engaging position, and in the open position of the electronic device, the magnetic arrangement is in the shielded position; in the shielded position, the magnetic shielding element at least partially reduces or eliminates a portion of the magnetic field extending outside of the first portion, and in the engaging position, the magnet magnetically engages the magnetically attractable arrangement.

Many of the attendant features will be more readily appreciated as the same become better understood by reference to the following detailed description considered in connection with the accompanying drawings.

DESCRIPTION OF THE DRAWINGS

The present description will be better understood from the following detailed description read in light of the accompanying drawings, wherein:

In FIGS. 1 to 7B, the electronic devices and magnetic arrangements are illustrated as schematic drawings. The drawings may not be to scale.

DETAILED DESCRIPTION

The detailed description provided below in connection with the appended drawings is intended as a description of a number of embodiments and is not intended to represent the only forms in which the embodiments may be constructed, implemented, or utilized.

An electronic device is disclosed. The electronic device may comprise a first portion and a second portion, the first and second portion being pivotably connected to each other, the electronic device thereby being pivotable between a closed position and at least one open position. In an embodiment, the electronic device is pivotable between a closed position and a plurality of open positions. The electronic device may further comprise a magnetically attractable arrangement disposed within or on the second portion; a magnetic arrangement disposed within or on the first portion, the magnetic arrangement comprising a magnet having a magnetic field and a magnetic shielding element; wherein at least one of the magnet or the magnetic shielding element is configured to move translationally with respect to the other between a shielded position and an engaging position when the first portion is pivoted with respect to the second portion, so that in the closed position of the electronic device, the magnetic arrangement is in the engaging position, and in the open position of the electronic device, the magnetic arrangement is in the shielded position; in the shielded position, the magnetic shielding element at least partially reduces or eliminates a portion of the magnetic field extending outside of the first portion, and in the engaging position, the magnet magnetically engages the magnetically attractable arrangement.

In one or more embodiments of the electronic device, the magnetic field outside of the first and second portion of the electronic device or device assembly may be minimized. Thereby it may be possible to reduce or eliminate the risk of the magnetic field outside the electronic device causing any harmful effects, for instance erasing data from or destroying magnetic stripes in objects such as credit cards, keycards, identification badges, or magnetic cards from parking garages. The electronic device may not be prone to mechanical failures. The electronic device according to one or more embodiments may be capable of locking the first and second portion to each other without mechanical dents, detents or latches visible on the outside of the device. The magnet(s) and other components involved in the locking may not necessarily be at all visible to the outside of the electronic device. Further, electronic devices that are pivotable up to 180 degrees or 360 degrees may be locked.

Figure 1A:
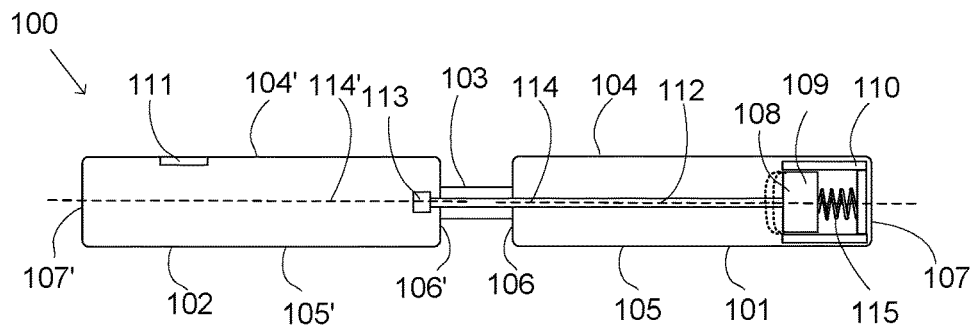
FIGS. 1A and 1B illustrate alternative schematic sectional side views and details of an embodiment of an electronic device.

FIG. 1A illustrates an electronic device 100 according to an embodiment. The electronic device 100 may be, for instance, a mobile device, a tablet computer, a laptop, a smartphone or a mobile phone, a phablet, a media player, a personal digital assistant, an e-book reader, a game console, a wearable device, a display or a flat-screen television. It comprises a first portion 101 and a second portion 102, such as blocks. The first and second portion 101, 102 may be pivotably, e.g. rotatably, hingedly or foldably, connected by a suitable structure, such as a hinge region 103. The electronic device 100 may be pivotable, so that the first portion 101 may be pivoted with respect to the second portion 102. In this embodiment, the electronic device 100 is foldable. In an embodiment, the hinge region 103 may also be a foldable region. The first portion 101 and the second portion 102 may be separate bodies, joined together by the hinge region 103, or they may be integral parts of the electronic device 100 formed as one single body e.g. by folding the electronic device 100 into two portions.

The "hinge region" may refer to any hinge element or structure providing rotating, folding or hinged movement between the portions about an axis. The hinge region 103 may include any structural element which allows the portions 101 and 102 to fold and/or rotate with respect to each other. This folding and/or rotation may be along or substantially along the edges of portions 101 and 102 which are joined via the hinge region 103. The hinge region 103 may be a region of the electronic device 100 that is more easily foldable than other parts of the electronic device 100. The hinge region 103 may be any type of hinge region, for instance a live hinge. In an embodiment, the hinge region 103 comprises a hinge element. Further, the electronic device 100 may comprise one, two or more hinge elements, i.e. a plurality of hinge elements.

The hinge region 103 may allow various degrees of freedom of rotation or folding between the first and second portions 101 and 102. In an embodiment, the hinge region 103 may extend end to end between the edges of the first and second portion 101 and 102. In another embodiment, the hinge region 103 may join the edges of the first and second portion 101 and 102 only at certain points along the edges.

The electronic device 100 of FIG. 1A is shown as a cross-sectional side view. In this exemplary embodiment, the first portion 101 and the second portion 102 are substantially planar or planar with their length and width being substantially larger than their thickness, but in other embodiments, they may have different shapes. For example, in an embodiment, the first portion 101 and/or the second portion 102 is curved. The first portion 101 and the second portion 102 may have at least two opposite main faces, depending on their overall shape. In this embodiment, the first portion 101 has two opposite main faces 104 and 105; the second portion 102 has two opposite main faces 104' and 105'. A first end 106 of the first portion 101 is connected to a first end 106' of the second portion by the hinge region 103. The first ends 106 and 106' are proximal to the hinge region 103. The first portion 101 has a second end 107 and the second portion 102 a second end 107', the second ends 107 and 107' being distal to the hinge region 103. The dimensions and shapes of the first and second portion 101, 102 and their faces and ends may depend e.g. on the type and overall size of the electronic device 100. For instance, in an embodiment, one or both of the main faces 105 and 105' may be curved. The first portion 101 and second portion 102 have central axes 114 and 114', respectively. In an embodiment, the central axes 114, 114' are parallel to the main faces 104 and 104' of the first and second portion 101, 102.

In an embodiment, the first portion 101 is pivotable to an angle between 0° or substantially 0° and 360° or substantially 360° with respect to the second portion 102. In an embodiment, the first portion 101 is pivotable to an angle between 0° or substantially 0° and 180° or substantially 180° with respect to the second portion 102. In other words, the hinge region 103 may provide freedom of rotation from 0° or substantially 0° to 180° or substantially 180° between the first and second portion 101 and 102; or the hinge region 103 may provide freedom of rotation from 0° or substantially 0° to 360° or substantially 360° between the first and second portion 101 and 102. This may allow the device to be pivotable, rotatable or foldable between at least one closed position, a flat position and a plurality of open positions. In FIG. 1A, the electronic device 100 is in a flat position, in which there is an angle of 180° or substantially 180° between the main face 104 of the first portion 101 and the main face 104' of the second portion 102. This flat position may also be considered to be an open position. In other open positions, the electronic device 100 may be pivoted so that there is an angle between 0° to 180° or substantially 180° between the main face 104 of the first portion 101 and the main face 104' of the second portion 102. In an embodiment, substantially 180° may refer to an angle of 180°±5°. In an embodiment, substantially 0° may refer to an angle of 0° to 5°. In an embodiment, substantially 360° may refer to an angle of 350° to 360°.

A magnetic arrangement 108 is disposed within the first portion 101. As it is disposed inside the first portion 101, it is not visible to the outside of the first portion 101. In an embodiment, the magnetic arrangement 108 is disposed distally to the hinge region 103. The magnetic arrangement 108 comprises at least a magnet 109 having a magnetic field and a magnetic shielding element 110. The magnetic field is illustrated with dashed lines, which should be understood as a schematic illustration only and not representative of the actual field or its strength. The magnetic shielding element 110 is configured to restrict the magnetic field of the magnet 109. In this embodiment, the magnetic shielding element 110 surrounds the magnet 109 at least partially, in particular the sides of the magnet 109 that are disposed towards the main faces 104 and 105. In an embodiment, the magnetic shielding element 110 surrounds the side(s) of magnet 109 disposed towards the second end 107 of the first portion 101, thereby being configured to restrict the magnetic field extending towards and/or beyond the second end 107. While the magnetic shielding element 110 does not eliminate the magnetic field of the magnet 109, it may eliminate or reduce the effect or strength of the magnetic field of the magnet 109 in the direction that is towards the magnetic shielding element 110 by providing a path for completing a magnetic circuit. Subsequently, it may further preferentially guide or concentrate at least a part of the magnetic field or the strength of the magnetic field towards one or more sides of the magnet 109. The magnetic shielding element 110 may be suitably shaped so as to restrict the magnetic field of the magnet 109 as desired. In an embodiment, the magnetic shielding element 110 may be cup-shaped or box-shaped, with an opening at one or more sides, e.g. towards the inside of the first portion 101. As schematically illustrated by dashed lines, the density of the magnetic field extending outside the magnetic shielding element 110 is substantially restricted or concentrated to a particular direction or a particular space surrounding the magnet 109 at least partially.

The second portion 102 comprises a magnetically attractable arrangement 111. In this exemplary embodiment, the magnetically attractable arrangement 111 comprises a magnetically attractable element, such as an iron plate or any other suitable ferromagnetic element. The magnetically attractable element 111 may also be a magnet. The magnetically attractable arrangement 111 may be disposed on or within the second portion 102. However, as described below, the magnetically attractable element 111 may instead be replaced by any one of the magnetic arrangements described in this specification.

The magnetic shielding element 110 is configured to partially magnetically shield the magnet 109, thereby restricting its magnetic field. The magnetic arrangement 108 is, in this open position of the electronic device 100, in a shielded position. In the shielded position, the magnetic shielding element 110 at least partially reduces or eliminates a portion of the magnetic field extending outside of the first portion 101. The magnetic field of the magnet 109 is thereby restricted, i.e. confined, substantially within the first portion 101. The magnetic field outside the first a portion 101, e.g. outside its main faces 104, 105 and in some embodiments also outside the first and second ends 106, 107, may thus be minimized. When the magnetic arrangement 108 is in the shielded position, the strength of the magnetic field (magnetic flux density) outside the first portion 101, e.g. outside its main faces 104, 105 and optionally also outside the first and second ends 106, 107, may be at most 100 mT, or at most 40 mT. In an embodiment, the magnetic field of the magnet 109 is restricted substantially within the first portion 101 when the strength of the magnetic field (magnetic flux density) outside the first portion 101, e.g. outside its main faces 104, 105 and optionally also outside the first and second ends 106, 107, is at most 100 mT, or at most 40 mT.

The magnetic shielding element 110 may be of a magnetically shielding material, such as a ferromagnetic material. For instance, the magnetic shielding element 110 may be formed of iron or other ferromagnetic metal, a ferromagnetic alloy, a Mu-metal, a nano-material with suitable magnetic permeability, or any other suitable material with magnetic shielding properties.

The magnetic arrangement 108 is configured to be moved between a shielded position and an engaging position. The electronic device 100 further comprises an actuator configured to move the magnet 109 with respect to the magnetic shielding element 110 between the shielded position and the engaging position. In this embodiment, the actuator is a non-extensible element 112 that is connected to the magnetic arrangement element 108. In this embodiment, the non-extensible element 112 is connected at one end to the magnet 109; however, as described below, the non-extensible element 112 may also be connected at one end to the magnetic shielding element 110 and thereby be configured to move the magnetic shielding element 110 with respect to the magnet 109. As another end of the non-extensible element 112 is fixedly attached to the second portion 102, the non-extensible element 112 is fixed with respect to the second portion 102. The non-extensible element 112 may be attached via an attachment arrangement 113 to the second portion 102. The attachment arrangement 113 may be any arrangement, structure or element capable of preventing longitudinal motion of the non-extensible element 112 as a whole with respect to the second portion 102. The attachment arrangement 113 may be adhesion based, mechanical, electro-mechanical or any combination of these, for instance a bracket, a clamp, a clip, a rivet, a pin, an adhesive, or a magnetic attachment arrangement.

The non-extensible element 112 is at least partially disposed between the first and second portions 101 and 102, extending between them and to the second portion 102. The non-extensible element 112 may, as in this exemplary embodiment, further extend along or within at least a part of the first portion 101 and optionally also within the second portion 102. In this embodiment, the non-extensible element 112 is partially disposed and extends within the hinge region 103.

The magnet 109 and the end of the non-extensible element 112 connected thereto are configured to move longitudinally within the first portion 101 and with respect to the first portion 101. The non-extensible element 112 may bend and/or flex so that the when in use, the first portion 101 is pivoted with respect to the second portion 102 such that the non-extensible element 112 applies a pulling or pushing force on the magnet 109. The magnet 109 is thereby configured to move with respect to the magnetic shielding element 110. However, in other embodiments, the magnetic shielding element 110 may move with respect to the magnet, as described below, or both the magnet 109 and the magnetic shielding element 110 may move. The non-extensible element 112 may be non-compressible, so that it retains its length upon pivoting of the first portion 101 with respect to the second portion 102 regardless of the direction or of the angle of the pivoting, and of the direction of the motion of the magnet 109. The non-extensible element 112 may be elongated. The magnet 109 may thus be movable in the direction of the length, i.e. in the direction of the longitudinal axis, of the non-extensible element 112. Thus the magnet 109 is configured to move translationally with respect to the magnetic shielding element 110 when the first portion 101 is pivoted with respect to the second portion 102. The magnetic shielding element 110 may be immovable with respect to the first portion 101, e.g. fixedly attached by any suitable attachment arrangement, such as by an adhesive, by deposition, or by a suitable mechanical attachment structure, to the first portion 101. In this embodiment, the magnet 109 is configured to move in the direction of the central axis 114 of the first portion 101 and/or in the direction of the main face 104 of the first portion 101. The translational movement may refer to movement in which the center of mass of the magnet 109 moves with respect to the magnetic shielding element 110 or, in embodiments in which the magnetic shielding element moves translationally with respect to the magnet, the center of mass of the magnetic shielding element moves with respect to the magnet, as opposed to rotational movement. In an embodiment, the polarity of the magnet 109 with respect to the magnetic shielding element 110 is configured to remain unchanged between the shielded position and the engaging position. In an embodiment, the direction of the magnetic axis of the magnet 109 with respect to the magnetic shielding element 110 is configured to remain unchanged between the shielded position and the engaging position. In an embodiment, the direction of the magnetic axis of the magnet 109 is configured to remain at a fixed angle with respect to the magnetic shielding element 110 between the shielded position and the engaging position. At least one of the magnet 109 or the magnetic shielding element 110 may slide within the first portion 101.

The non-extensible element 112 may be bendable and/or flexible. The material of the non-extensible element 112 is not particularly limited, and various materials, such as metal, plastic or fabric, or any combination thereof, may be contemplated. The non-extensible element 112 may be or comprise, for example, a wire element, a wire, such as a tension wire, a metal wire, a flexible or bendable rod, a chain element, a chain, a ribbon or another type of element. The non-extensible element 112 may have a length that is predetermined. The length of the non-extensible element 112 thus does not change upon pivoting of the first portion 101 with respect to the second portion 102.

The magnet 109 may be configured to move a suitable distance with respect to the magnetic shielding element 110. The distance may be, for example, in the range of 1 mm to 15 mm, or in the range of 3 mm to 10 mm. A suitable distance may be selected based on one or more properties, such as the dimensions of the electronic device 100, the first and second portion 101, 102, the hinge region 103, the magnetic shielding element 110 or the non-extensible element 112, on the magnetic properties of the magnet 109 and/or of the magnetic shielding properties of the magnetic shielding element 110.

The electronic device 100 further comprises a returning arrangement 115 configured to return the magnetic arrangement 108 to the shielded position. The returning arrangement 115 may, however, not always be necessary. Further, the non-extensible element 112 may also, in some embodiments, function as a returning arrangement, e.g. in embodiments in which it is configured to push the magnet 109 (or the magnetic shielding element 110) to the shielded position. The returning arrangement 115 may be configured to return the magnetic arrangement 108 to the shielded position when the electronic device 100 is pivoted from a closed position to an open position. The returning arrangement 115 may be configured to return the magnetic arrangement 108 to the shielded position in particular when the first portion 101 is pivoted with respect to the second portion 102 towards a greater angle or, in this embodiment, towards an angle of 180° or substantially 180°, or towards a flat position, or towards an open position, such as an open position in which there is an angle of substantially 90° between the first and second portion 101, 102. In an embodiment, the returning arrangement 115 is a mechanical returning arrangement. The mechanical returning arrangement may comprise or be e.g. an elastic element, such as a spring element. The spring element may be e.g. the helical spring depicted in FIG. 1A, but other types of spring elements may also be contemplated. In another embodiment, the returning arrangement may comprise a magnetically attractable element, such as another magnet. Further, as the magnet 109 may be attracted to the magnetic shielding element 110, in an embodiment, the magnetic shielding element 110 may function as a returning arrangement.

The returning arrangement 115 may also be a restricting arrangement, so that it is configured to restrict, i.e. to resist but not completely prevent, the movement of the magnet 109. The returning or restricting arrangement 115 may be configured to exert a pulling force on the magnet 109 so that it restricts the movement of the magnet 109 upon pivoting of the first portion 101 with respect to the second portion 102 towards a smaller angle or, in this embodiment, towards an angle of 0°. Upon pivoting of the first portion 101 with respect to the second portion 102 towards a greater angle, the restricting arrangement 115 does not necessarily restrict the motion of the magnet 109; however, it may exert a pulling force pulling the magnet 109 towards the shielded position or its extreme position, such as the position it is configured to assume when the electronic device 100 is at a flat position. In an embodiment, the restricting arrangement 115 is configured to restrict the longitudinal movement of the magnet 109. Although depicted here in the context of the embodiment of FIG. 1A, a returning or restricting arrangement according to one or more embodiments may be included in an electronic device according to any one of the embodiments described in this specification.

Figure 1B:
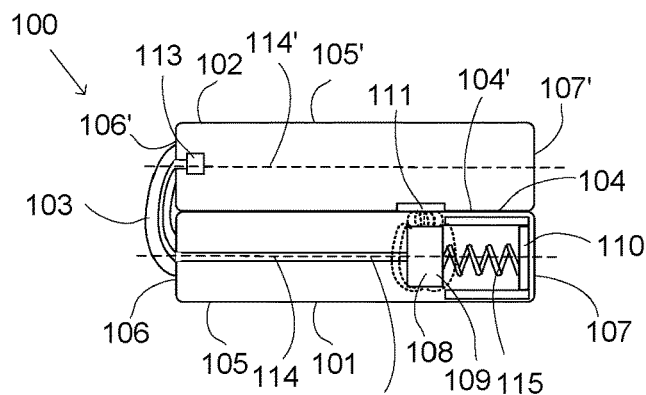

FIG. 1B illustrates the same electronic device 100 in a closed position with an angle of 0° or substantially 0° between the main face 104 of the first portion 101 and the main face 104' of the second portion 102. In the closed position, the first portion 101 and the second portion 102, i.e. the main faces 104 and 104' that are brought near to each other, to face each other and may rest against each other. In the closed position, the magnet 109 and the magnetically attractable element 111 are thus also brought near to each other, i.e. proximate, by the hinge region 103.

In the closed position, a larger portion of the non-extensible element 112 extends within the hinge region 103 as compared to the flat position, so that a smaller portion of the non-extensible element 112 extends within the first portion 101. As the first portion 101 has been pivoted to the closed position with respect to the second portion 102, the non-extensible element 112 has pulled and thereby moved the magnet 109 in the direction of the longitudinal axis of the non-extensible element 112, so that the magnet 109 has moved translationally with respect to the magnetic shielding element 110, so that in the closed position of the electronic device 100, the magnetic arrangement 108 is in an engaging position. In the engaging position, the magnetic shielding element 110 magnetically shields the magnet 109 to a smaller extent than in the shielded position, thereby restricting its magnetic field to a smaller extent than in the shielded position. In this exemplary embodiment, in the engaging position, the magnet 109 is no longer disposed within the magnetic shielding element 110. The returning arrangement 115, i.e. the spring in this exemplary embodiment, is stretched in the engaging position.

In the engaging position, the magnet 109 may magnetically engage the magnetically attractable element 111. As the magnet 109 and the magnetically attractable element 111 are near to each other in the closed position, they complete a magnetic circuit, thereby exerting a force on each other sufficiently strong to retain, i.e. lock, the electronic device 100 in the closed position. The magnetically attractable element 111 may be superimposed or in alignment with the magnet 109 in the closed position, so that such that they attract each other and magnetically engage each other with a sufficient strength. The polarity of the magnet 109 may be arranged with respect to the magnetically attractable element 111 such that the attraction between them may be suitable. In this embodiment, either the north pole or the south pole of the magnet 109 may be configured to be disposed towards the magnetically attractable element 111 in the closed position.

In an embodiment, the material of the first and second portion 101, 102, e.g. of outer shells of the first and second portion 101, 102 or of the main faces 104, 104', or any parts thereof extending between the magnet 109 and the magnetically attractable element 111 in the closed position, is a non-ferromagnetic material. A ferromagnetic material extending between the magnet 109 and the magnetically attractable element 111 may interfere with the magnet 109 and the magnetically attractable element 111 magnetically engaging each other.

Figure 2A:
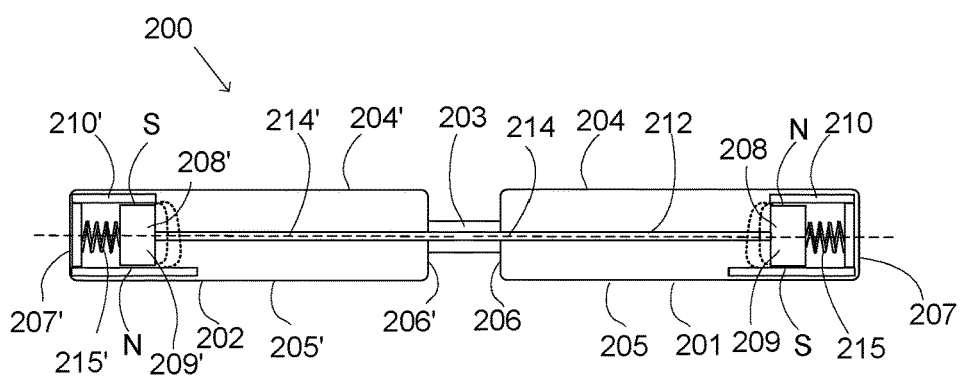
FIGS. 2A and 2B illustrate alternative schematic sectional side views and details of an embodiment of an electronic device.
Figure 2B:
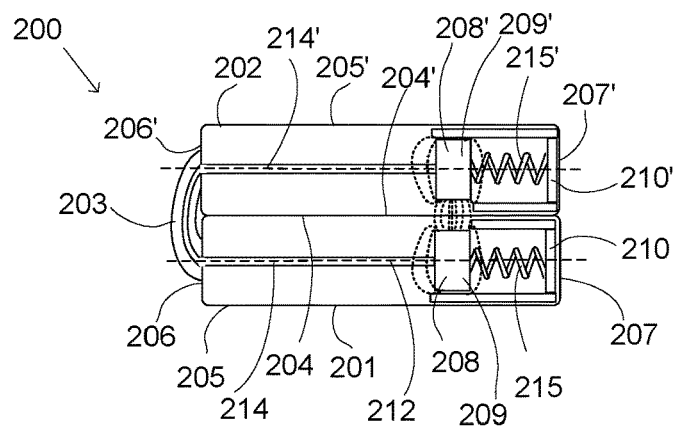

FIGS. 2A and 2B show a schematic cross-sectional side view of an embodiment of an electronic device 200. The electronic device 200 again comprises a first portion 201 and a second portion 202 connected to each other, the first and second portion 201, 202 being pivotable about a hinge element 203. The first and second portion 201, 202 have central axes 214, 214', first ends 206, 206' and second ends 207, 207', respectively, in a manner generally similar to the embodiment shown in FIGS. 1A and 1B. In FIG. 2A, the electronic device 200 is in a flat position, so that there is an angle of substantially 180° between the main faces 204, 204'. In FIG. 2B, the electronic device 200 is in a closed position, in which the main faces 204, 204' of the first and second portion 201, 202 face each other and may rest against each other so that there is an angle of substantially 0° between the main faces 204, 204'; the opposite main faces 205, 205' are facing towards opposite directions. The electronic device 200 is pivotable to a plurality of open positions between the flat position and the closed position.

The electronic device 200 comprises a first magnetic arrangement 208 within the first portion 201, the first magnetic arrangement comprising a first magnet 209 having a magnetic field and a first magnetic shielding element 210. The exemplary embodiment of the electronic device 200 shown in FIGS. 2A and 2B differs from that of FIGS. 1A to 1B at least in that the magnetically attractable arrangement is a second magnetic arrangement 208' disposed within the second portion 202. The second magnetic arrangement 208' is similar to the first magnetic arrangement 208 disposed within the first portion 201 and comprises a second magnet 209' and a second magnetic shielding element 210'. The first and second magnetic arrangements 208, 208' are configured to be moved between a shielded position and an engaging position. Both the first and second magnetic arrangements 208, 208' are in a shielded position when the electronic device 200 is in an open position, such as the flat position shown in FIG. 2A, and in the engaging position when the electronic device 200 is in a closed position, as shown in FIG. 2B.

In one or more embodiments comprising at least two magnets, the locking of the portions may be efficient and sufficiently strong. Two magnets may be capable of magnetically engaging each other at a distance greater than a magnet and a magnetically attractable arrangement that is not a magnet, such as a ferromagnetic element.

The first and second magnetic shielding element 210, 210' may restrict the magnetic fields of the first and second magnet 209, 209' so that when the first and second magnet 109, 109' are not magnetically engaged, their magnetic fields are restricted mainly within the first and second portion, respectively. In the shielded position, the first and second magnetic shielding elements 210, 210' at least partially reduce or eliminate a portion of the magnetic fields extending outside of the first portion 201 and the second portion 202. In other words, most of the magnetic fields of the first and second magnet 209, 209' or their densities may be confined within the first and second portion 201, 202, respectively. Thus the strength of the magnetic field outside the first and second portion 201, 202, e.g. outside their main faces 204, 205, 204' 205' and optionally also outside the first and second ends 206, 206', 207, 207', i.e. leakage flux in the space outside the first and second portion 201, 202, may be minimized. In an embodiment, when the first and second magnet 209, 209' are not magnetically engaged, the strength of the magnetic fields outside the first and second portion 201, 202, e.g. outside their main faces 205, 205, 204', 205' and optionally also outside the first and second ends 206, 206', 207, 207' may be at most 100 mT, or at most 40 mT. In contrast, the strength of the magnetic field inside the first and second portion 201, 202, such as in regions adjacent to the magnets 208, 208', may be much greater, for example of the magnitude of 1500 mT or more.

Although in this embodiment, the magnetically attractable arrangement is the second magnetic arrangement 208' disposed within the second portion 202, the second magnetic arrangement 208' could, in other embodiments, be replaced by any magnetically attractable arrangement or element described in this specification, such as the magnetically attractable element 111 described in the context of FIGS. 1A and 1B.

The exemplary embodiment of the electronic device 200 shown in FIGS. 2A and 2B further differs from that of FIGS. 1A to 1B at least in that the non-extensible element 212 is connected to both magnets 209, 209', extending between them within the first and second portions 201, 202 and within the hinge element 203. Neither end of the non-extensible element 212 is fixed with respect to either the first portion 201 or the second portion 202. In other words, the entire non-extensible element 212 may be movable with respect to the first and second portion 201, 202. However, in an embodiment, a part of the non-extensible element 212 may be fixed with respect to the first portion 201, the second portion 202 or both using a suitable attachment arrangement. For example, the non-extensible element 212 may be fixed at its central part to a part of the hinge element 203. The non-extensible element 212 is configured so that pivoting of the first portion 201 with respect to the second portion 202 causes motion of the first magnet 209' with respect to the first magnetic shielding element 210 and motion of the second magnet 209' with respect to the second magnetic shielding element 210'. In this embodiment, the first and second magnet 209, 209' also move with respect to the first and second portion 201, 202, respectively.

In order to prevent uncontrolled movement of the first and second magnets 209, 209' and of the entire non-extensible element 212 in the direction of its length, a first and second returning and restricting arrangements 215, 215' are configured to restrict the movement of the first and second magnet 209, 209', respectively, and to return them into the shielding position. The restricting arrangements 215, 215' may be any restricting arrangements described in this specification and may be independently selected from any restricting arrangements described in this specification.

The exemplary embodiment of the electronic device 200 shown in FIGS. 2A and 2B further differs from that of FIGS. 1A to 1B at least in that the first and second magnetic shielding elements 210, 210' extend, at their sides facing towards the main faces 205, 205', further towards the first ends 206, 206' of the first and second portion 201, 202 (i.e. further than at their sides facing towards the opposite main faces 204, 204'). In the closed position, the sides of the first and second magnetic shielding elements 210, 210' that are disposed towards the main faces 205, 205' shield the sides of the first and second magnets 209, 209' that are disposed towards the main faces 205, 205', thereby restricting the magnetic fields of the first and second magnet 209, 209' outside of the main faces 205, 205' of the first and second portion 201, 202. The first and second magnetic shielding elements 210, 210' also extend at or near the second ends 207, 207' of the first and second portion 201, 202, respectively, thereby restricting the magnetic fields of the first and second magnet 209, 209' outside of the second ends 207, 207'.

The polarities of the first and second magnets 209, 209' may be arranged such that they attract each other and magnetically engage each other with a sufficient strength to retain, i.e. lock, the electronic device 200 in the closed position. For instance, the north pole N of the first magnet 209 may face the south pole S of the second magnet 209' in the closed position, or vice versa.

Other aspects of the embodiment shown in FIGS. 2A to 2B may be generally similar to those of the embodiment shown in FIGS. 1A to 1B.

Figure 3A:
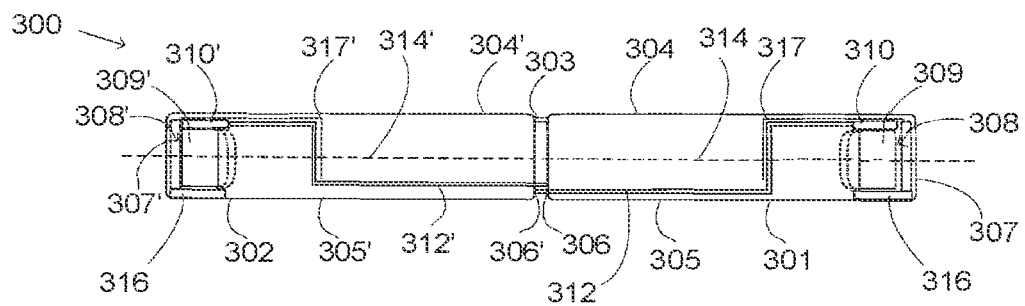
FIGS. 3A and 3B illustrate alternative schematic sectional side views and details of an embodiment of an electronic device.

FIG. 3A illustrates an embodiment of an electronic device 300 comprising a first and second magnetic arrangement 308, 308'. The exemplary embodiment of the electronic device 300 shown in FIGS. 3A and 3B differs from those of FIGS. 1A to 2B at least in that the first and second magnetic arrangements 308, 308' comprise a first and second magnetic shielding element 310, 310', respectively, which are configured to move translationally with respect to a first and second magnet 309, 309', respectively. The first and second magnet 309, 309' may be immovable with respect to the first and second portion 301, 302, respectively. For example, the first and second magnets 309, 309' may be fixedly attached to the first and second portion 301, 302, respectively. The first and second magnetic shielding elements 310, 310' may be configured to move in the direction of the main faces 304, 304' and/or of the central axes 314, 314' of the first and second portion 301, 302, respectively. In the flat position shown in FIG. 3A and in a plurality of other open positions, the first and second magnetic arrangements 308, 308' are in a shielded position, and the first and second magnetic shielding element 310, 310' at least partially shield the first and second magnet 309, 309', respectively. The first and second magnetic arrangements 308, 308 may further comprise auxiliary magnetic shielding elements 316, 316' that may be immovable with respect to the first and second magnet 309, 309' and the first and second portion 301, 302, respectively. The auxiliary magnetic shielding elements 316, 316' may restrict the magnetic fields of the first and second magnet 309, 309' in the directions of the first and second magnet that are disposed towards the opposite main faces 305, 305' and/or the second ends 307, 307', of the first and second portions 301 and 302, respectively. Thus in this embodiment, the magnetically attractable arrangement comprises or is the second magnetic arrangement 308', in particular the second magnet 309'.

In the shielded position, the first and second magnetic shielding elements 310, 310' at least partially reduce or eliminate a portion of the magnetic fields extending outside of the first portion 301 and the second portion 302. The magnetic fields of the first and second magnets 309, 309' (illustrated schematically with dashed lines) may therefore be restricted substantially inside the first and second portion 301, 302, respectively. Thus the magnetic field outside the first and second portion 301, 302, e.g. outside their main faces 304, 305, 304', 305' and in some embodiments also outside the first and second ends 306, 307, 306' 307', may be minimized. When the magnetic arrangements 308, 308' are in the shielded position, the strength of the magnetic fields (magnetic flux density) outside the first and second portion 301, 302, e.g. outside their main faces 304, 305, 304', 305' and optionally also outside the first and second ends 306, 307, 306' 307', may be at most 100 mT, or at most 40 mT. In an embodiment, the magnetic fields of the first and second magnet 309, 309' are restricted substantially inside the first and second portion 301, 302 when the strength of the magnetic fields (magnetic flux density) outside the first and second portion 301, 302, e.g. outside their main faces 304, 305, 304', 305' and optionally also outside the first and second ends 306, 307, 306' 307', is at most 100 mT, or at most 40 mT.

Although in this embodiment, the magnetically attractable arrangement is a second magnetic arrangement 308' disposed within the second portion 302, the second magnetic arrangement 308' could, in other embodiments, be replaced by any magnetically attractable arrangement or element described in this specification, such as the magnetically attractable element 111 described in the context of FIGS. 1A and 1B or the second magnetic arrangement 208 described in the context of FIGS. 2A and 2B.

Figure 3B:
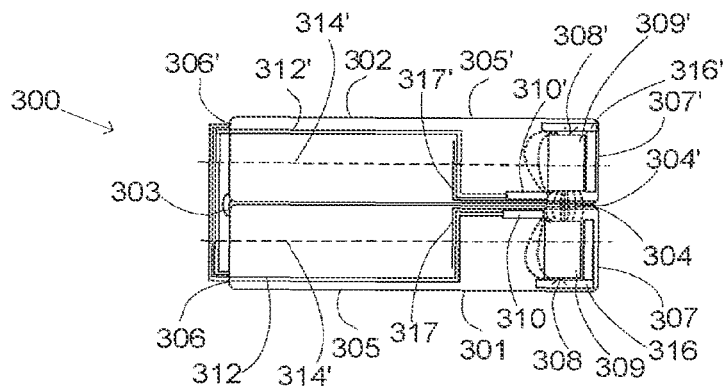

The exemplary embodiment of the electronic device 300 shown in FIGS. 3A and 3B further differs from that of FIGS. 1A to 2B at least in that it comprises two non-extensible elements 312, 312', a first non-extensible element 312 connected at one end to the first magnetic shielding element 310 and a second non-extensible element 312' connected at one end to the second magnetic shielding element 310'. The other ends of the non-extensible elements 312, 312' are connected to the first ends 306', 306 of the second and first portion 302, 301 respectively. In this embodiment, the non-extensible elements 312, 312' are connected to the first ends 306', 306 of the second and first portion 302, 301, respectively, asymmetrically with respect to the central axes 314, 314' of the first and second portion 302, 301. In other words, the non-extensible elements 312, 312' are connected to the first ends 306', 306 of the second and first portion 302, 301, respectively, at a distance from the central axes 314, 314'. This distance may be the same or different for the first and second non-extensible element 312, 312'. It may further be understood that these two non-extensible elements 312, 312' could also be replaced by the non-extensible element 212 described in the context of the embodiment shown in FIGS. 2A and 2B, or that these two non-extensible elements 312, 312' could also replace the non-extensible element 212 in the embodiment shown in FIGS. 2A and 2B.

In this embodiment, the electronic device 300, i.e. the first and second portion 301, 302, comprises guide structures 317, 317' configured to guide the movement of the first and second magnetic shielding elements 310, 310', respectively. In this embodiment, the guide structures 317, 317' are also configured to guide the non-extensible elements 312, 312' and movement thereof in a desired manner and direction. In an embodiment, such a guide structure may include a passage such as a tunnel or a channel in the material surrounding the magnetic shielding elements 310, 310'. In another embodiment, the magnetic shielding elements 310, 310' may have grooves or protrusions on one or more of its surfaces, with complementary protrusions or grooves in at least one surface inside or on the guide structures 317, 317', for instance inside or on a guide passage extending within the first portion 301. In an embodiment, the guide structures 317, 317' are guided tracks extending within the first and second portion 301, 302 configured to guide the movement of the magnetic shielding elements 310, 310' towards the opposing portion or in the direction opposite thereof.

Although not depicted in FIGS. 3A and 3B, the electronic device 300 may further comprise returning arrangements configured to return the magnetic arrangements 308, 308' and in particular the magnetic shielding elements 310, 310' into the shielding position. The returning elements may be any returning elements described in this specification.

In FIG. 3B, the electronic device 300 is in a closed position in a similar manner as described in the context of FIGS. 1B and 2B, and the first and second magnetic arrangements 308, 308' are in an engaging position. In this position, the first and second magnetic shielding elements 310, 310' no longer extend between the first and second magnet 309, 309', so that the first and second magnet 309, 309' may magnetically engage each other. The polarities of the first and second magnets 309, 309' may be arranged such that they attract each other and magnetically engage each other with a sufficient strength to retain, i.e. lock, the electronic device 300 in the closed position. For instance, the south pole of the first magnet 309 may face or be disposed towards the north pole of the second magnet 309' in the closed position, or vice versa.

Other aspects of the embodiment shown in FIGS. 3A to 3B may be generally similar to those of the embodiment shown in FIGS. 1A to 2B.

Figure 4A:
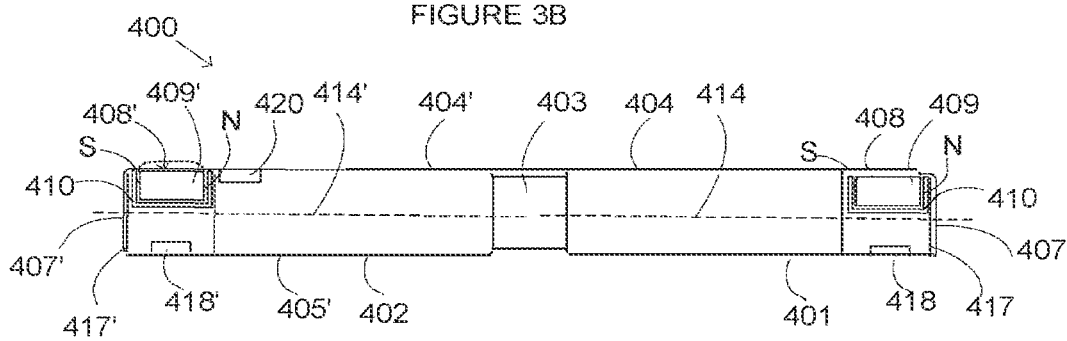
FIGS. 4A and 4B illustrate alternative schematic sectional side views and details of an embodiment of an electronic device.

FIG. 4A illustrates an embodiment of an electronic device 400 comprising a first and second magnetic arrangement 408, 408' disposed within the first and second portion 401, 402, respectively, the portions 401, 402 being connected to each other via a hinge region 403. In this embodiment, a first and a second magnetic shielding element 410, 410' are configured to move translationally with respect to a first and second magnet 409, 409', respectively. The first and second magnet 409, 409' may be immovable with respect to the first and second portion 401, 402, respectively. For example, the first and second magnets 409, 409' may be fixedly attached to the first and second portion 401, 402, respectively. The embodiment shown in FIGS. 4A and 4B differs from that of FIGS. 3A to 3B at least in that the first and second magnetic shielding elements 410, 410' are configured to move in a direction perpendicular to the direction of the main faces 404, 404' and/or of the central axes 414, 414' of the first and second portion 401, 402, respectively. The first and second magnetic shielding elements 410, 410' are configured to shield at least the north and south poles N and S and at least one side of the first and second magnet 409, 409' in the shielded position, so that they provide a path for completing a magnetic circuit and preferentially guide the magnetic fields of the magnets within this magnetic circuit. Thus they may also restrict or reduce portions of the magnetic fields of the magnets 409, 409' that extend outside the first and second magnetic shielding elements 410, 410'. The first and second magnetic shielding elements 410, 410' may be cup-shaped or box-shaped, with an opening towards the main faces 404, 405' of the first and second portion 401, 402. In the flat position shown in FIG. 4A and in other open positions, the first and second magnetic arrangements 408, 408' are in a shielded position, and the first and second magnetic shielding element 410, 410' at least partially shield the first and second magnet 409, 409', respectively. Although the magnetic arrangements 408, 408' are disposed distally to the hinge region 403, i.e. near to the second ends 407, 407' of the first and second portion 401, 402, they may also be disposed more proximally to the hinge region 403.

The electronic device 400 may further comprise guide structures 417, 417' configured to guide the movement of the magnetic shielding elements 410, 410' between the shielded position and the engaging position.

In this exemplary embodiment, the electronic device 400 comprises a first and second actuator 418, 418' configured to move the first and second magnetic shielding element 410, 410', respectively. The actuators 418, 418' may be mechanical actuators, such as spring-loaded actuators. They may also be e.g. solenoids configured to exert magnetic fields and thereby magnetic forces on the first and second magnetic shielding elements 410, 410' upon pivoting the first portion 401 with respect to the second portion 402 into the closed position. They may thus be configured to retract the magnetic shielding elements 410, 410' into the engaging position. In an embodiment, the electronic device 400 is configured to determine an angle between the first and second portion 401, 402, and based on the determined angle, to operate the actuators 418, 418'. The actuators may also function as returning arrangements.

As the electronic device 400 is pivoted between positions, the magnetic fields within, on and/or outside the electronic device 400 may change. In an embodiment, the electronic device comprises a sensor 420 configured to detect at least one of the magnetic fields of the first and second magnet and/or any changes thereof. The sensor 420 may be e.g. a Hall effect sensor. However, depending on the sensor 420, it may not be able to detect the magnetic fields when the magnets 409 or 409' are too far away from it. In an embodiment, the sensor 420 may be configured to detect at least one of the magnetic fields of the first and second magnet and/or any changes thereof when the angle between the first and second portions 401, 402 is up to 10°, up to 5°, or up to 2°. In an embodiment, the sensor may be configured to thereby determine an angle between the first and second portion. In an embodiment, the sensor may be configured to thereby cause at least one or both of the magnetic arrangements 408, 408' to move to the engaging position. In an embodiment, at least one actuator 418, 418' is configured to move at least one of the magnet 409 or the magnetic shielding element 410 based on the determined angle between the first and second portion 401, 402. Although described in the context of this embodiment, the sensor 420 may be included in any one of the embodiments of the electronic device described in this specification.

Figure 4B:
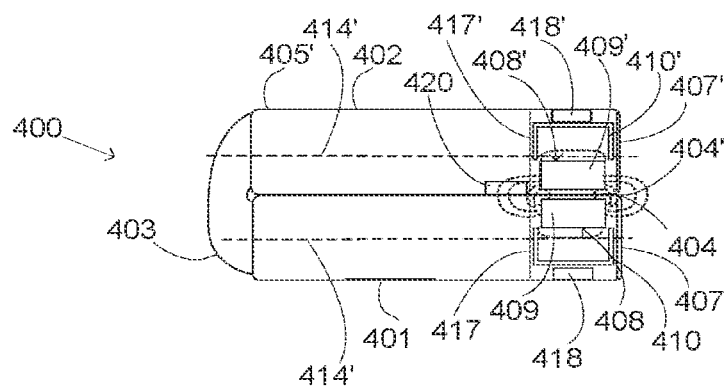

Although not depicted in FIGS. 4A and 4B, the electronic device 400 may further comprise returning arrangements configured to return the magnetic arrangements 408, 408' and in particular the magnetic shielding elements 410, 410' into the shielding position. The returning elements may be any returning elements described in this specification.

In this embodiment, the magnetically attractable arrangement comprises or is the second magnetic arrangement 408', in particular the second magnet 409'. Although in this embodiment, the magnetically attractable element is the second magnetic arrangement 408' disposed within the second portion 402, the second magnetic arrangement 408' could, in other embodiments, be replaced by any magnetically attractable element described in this specification, such as the magnetically attractable element 111 described in the context of FIGS. 1A and 1B or any one of the second magnetic arrangements 208 or 308 described in the context of FIGS. 2A to 3B.

FIG. 4B illustrates the same electronic device 400 in a closed position with an angle of 0° or substantially 0° between the main face 404 of the first portion 401 and the main face 404' of the second portion 402. In the closed position, the first portion 401 and the second portion 402 face each other and may rest against each other. In the closed position, the first and second magnet 409, 409' are brought near to each other. As the retracted magnetic shielding elements 410, 410' do not shield the magnets 409, 409', at least to the same extent as in the shielded position, the magnets 409, 409' may thus magnetically engage each other in the engaging position, locking the electronic device 400 in the closed position.

Other aspects of the embodiment shown in FIGS. 4A to 4B may be generally similar to those of the embodiment shown in FIGS. 1A to 3B.

Figure 5A:
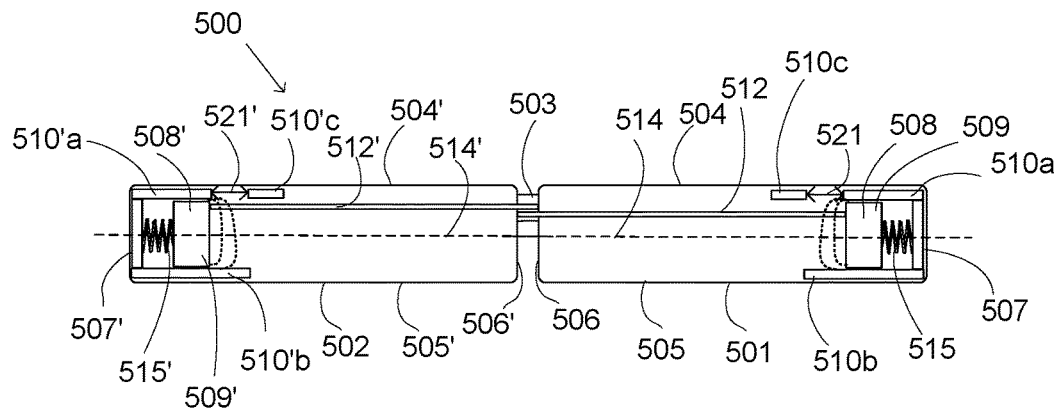
FIGS. 5A, 5B and 5C illustrate alternative schematic sectional side views and details of an embodiment of an electronic device.
Figure 5B:
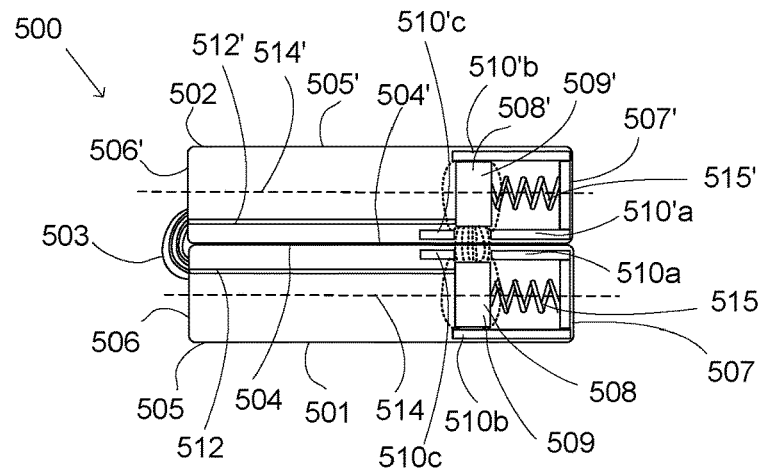
Figure 5C:
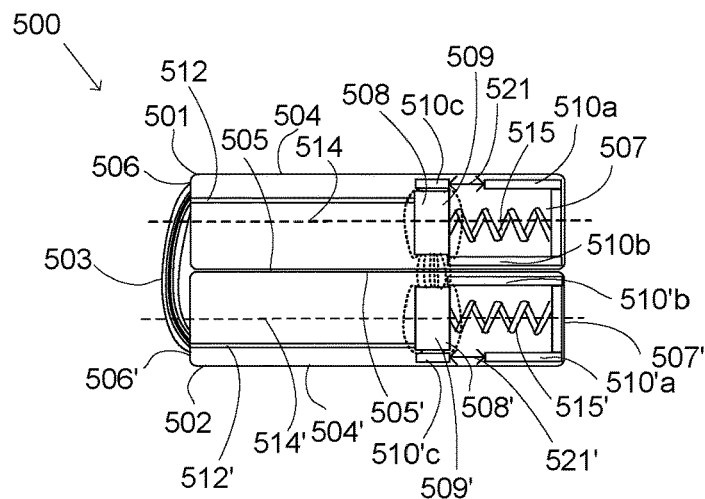

FIGS. 5A to 5C show an embodiment of an electronic device 500 that is generally similar to the embodiment shown in FIGS. 2A and 2B. The exemplary embodiment of the electronic device 500 shown in FIGS. 5A to 5C differs from that of FIGS. 2A to 2B at least in that the first portion 501 is pivotable with respect to the second portion 502 between an angle of 0° or substantially 0° to 360° or substantially 360°. The electronic device 500 is thus pivotable to at least two closed positions, the two closed positions being shown in FIGS. 5B and 5C, and to a plurality of open positions. One of the open positions, a flat position, is shown in FIG. 5A. In the flat position, the electronic device 500 may be substantially planar or planar. In the flat position, the magnetic fields of the first and second magnets 509, 509' of the first and second magnetic arrangements 508, 508' are substantially restricted within the first and second portion 501, 502, respectively.

FIG. 5B differs from FIG. 5A in at least that there is an angle of substantially 0° between the first and second portion 501, 502, i.e. between the main faces 504, 504', so that the electronic device 500 is in a first closed position. The main faces 504, 504' now face each other and may rest against each other. In this first closed position, the magnetic arrangements 508, 508' are in a first engaging position.

FIG. 5C differs from FIG. 5B in at least that the second portion 502 has been pivoted substantially 360 degrees with respect to the closed position shown in FIG. 5B. The first portion 501 and the second portion 502 are disposed at an angle of substantially 360° between the first and second portion 501, 502, i.e. between the main faces 504, 504'. The main faces 505, 505' now face each other and may rest against each other. In this second closed position, the magnetic arrangements 508, 508' are in a second engaging position.

In this embodiment, the electronic device 500 comprises two non-extensible elements 512, 512' that are connected to the first and second magnet 509, 509', respectively. Further, in this embodiment, the non-extensible elements 512, 512' are disposed and extend within the hinge element 503. The non-extensible elements 512, 512' are also connected to the first ends 506', 506 of the second and first portion 502, 501, respectively, asymmetrically with respect to the central axes 514, 514' of the first and second portion 501, 502. So when in use, the first portion 501 is pivoted with respect to the second portion 502 to the first closed position so that the first and second portion 501, 502 are disposed at an angle of 0° or substantially 0° to each other, the first and second magnet 509, 509' move a first distance. When the first portion 501 is pivoted with respect to the second portion 502 to the second closed position so that the first and second portion 501, 502 are disposed at an angle of 360° or substantially 360° to each other, the first and second magnet 509, 509' move a second distance. The first distance is different from the second distance. While in this embodiment the first distance is smaller than the second distance, the second distance may also be smaller than the first distance. In the two closed positions, the magnets 509, 509' are thus disposed in different engaging positions with respect to the first and second magnetic shielding elements 510, 510'. However, in both closed positions and both engaging positions, the magnets 509, 509' may magnetically engage each other, so that the electronic device 500 may be locked in either of the closed positions. Each of the magnets 509, 509' is thus configured to magnetically engage the other magnet or, if one of the magnets is replaced by another magnetically attractable arrangement, such a magnetically attractable arrangement facing either of the two opposite main faces in the closed position.

Further, the exemplary embodiment of the electronic device 500 shown in FIGS. 5A to 5C differs from that of FIGS. 2A to 2B at least in that the first and second magnetic shielding elements 510, 510' are configured to restrict the magnetic fields of the first and second magnet 509, 509' in a different manner in the first and second engaging positions shown in FIGS. 5B and 5C. The shapes of the first and second magnetic shielding elements 510, 510' may be chosen accordingly. In this exemplary embodiment, first portions 510a, 510'a of the first and second magnetic shielding elements 510, 510', respectively, are configured to restrict the magnetic fields of the first and second magnets 509, 509' in the shielded position, so that their magnetic fields do not substantially extend outside the main faces 504, 504' of the first and second portion 501, 502. Second portions 510b, 510'b of the first and second magnetic shielding elements 510, 510' are configured to restrict the magnetic fields of the first and second magnet 509, 509' in the shielded position and in the first engaging position shown in FIG. 5B so that the magnetic fields do not substantially extend outside the opposite main faces 505, 505' of the first and second portion 501, 502. Third portions 510c, 510'c of the first and second magnetic shielding elements 510, 510', respectively, are configured to restrict the magnetic fields of the first and second magnet 509, 509' in the second engaging position shown in FIG. 5C so that the magnetic fields do not substantially extend outside the main faces 504, 504' of the first portion 501. Openings 521, 521' (reference numbers not indicated in FIG. 5B for clarity) between the first and third portions 510a, 510'a and 510c, 510'c may allow the first and second magnet 509, 509' to magnetically engage each other in the first engaging position, when the electronic device 500 is in the first closed position. In the second engaging position, the second portions 510b, 510'b of the first and second magnetic shielding elements 510, 510' are configured not to substantially restrict the magnetic fields of the first and second magnet 509, 509', so that the first and second magnet 509, 509' may magnetically engage each other when the electronic device 500 is in the second closed position. In both engaging positions, the magnetic fields of the first and second magnet 509, 509' may be substantially restricted within the first and second portion 501, 502, respectively. The first and second magnetic shielding elements 510, 510' may also be configured to restrict the magnetic fields extending towards and/or beyond the second ends 507, 507' of the first and second portion 501, 502, respectively.

A first and second returning and restricting arrangements 515, 515' are configured to restrict the movement of the first and second magnet 509, 509', respectively, and to return them into the shielding position.

Although in this embodiment, the magnetically attractable arrangement is the second magnetic arrangement 508' disposed within the second portion 502, the second magnetic arrangement 508' could, in other embodiments, be replaced by any magnetically attractable arrangement or element described in this specification, such as the magnetically attractable element 111 described in the context of FIGS. 1A and 1B.

Again, in each of the embodiments described in FIGS. 3A to 5C, the first and second magnetic shielding elements are configured to partially magnetically shield the first and second magnet, respectively, thereby restricting their magnetic fields. The magnetic arrangements are, in any open position of the electronic device, in a shielded position. In the shielded position, the magnetic shielding elements at least partially reduce or eliminate a portion of the magnetic fields extending outside of the first and second portion. The magnetic fields of the magnets are thereby restricted substantially within the first portion and second portion. The magnetic field outside the first portion and second portions, e.g. outside their main faces and in some embodiments also outside the first and second ends, may thus be minimized. When the magnetic arrangements are in the shielded position, the strength of the magnetic field (magnetic flux density) outside the first portion and second portion, e.g. outside of their main faces and optionally also outside the first and second ends, may be at most 100 mT, or at most 40 mT. In an embodiment, the magnetic fields of the first and second magnet are restricted substantially inside the first and second portion when the strength of the magnetic fields (magnetic flux density) outside the first and second portion, e.g. outside their main faces and optionally also outside the first and second ends, is at most 100 mT, or at most 40 mT.

Figure 6:
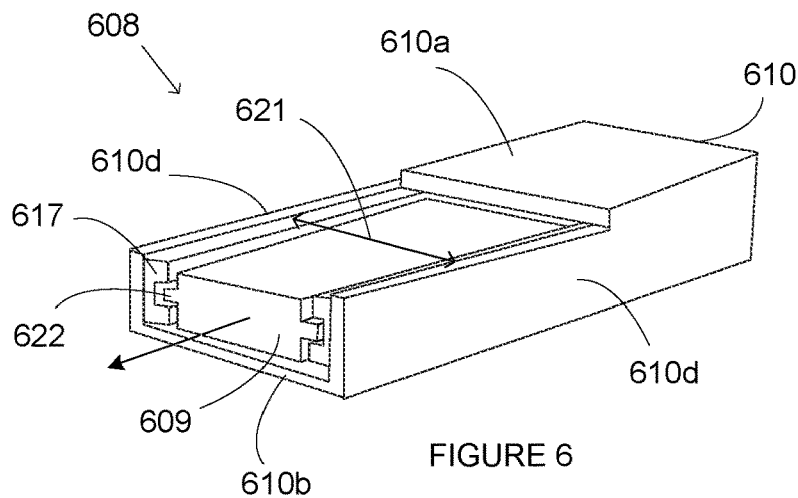
FIG. 6 illustrates a perspective view of an embodiment of a magnetic arrangement for an electronic device.

FIG. 6 illustrates an embodiment of a magnetic arrangement 608 which may be included in the embodiments of an electronic device 200 illustrated in FIGS. 2A and 2B. The magnetic arrangement comprises a magnet 609 and a magnetic shielding element 610. The magnetic shielding element 610 is monolithic and may be substantially box-shaped, and the magnet 609 may be disposed within the magnetic shielding element 610. The magnetic shielding element 610 has a top portion 610a, a bottom portion 610b and side portions 610d. The top portion 610a extends along a part of the length of the side portions 610d, such that there is an opening 621 at the top side of the magnetic shielding element 610. The bottom portion 610b extends along the entire length of the side portions 610d.

It should be understood that terms such as "top portion", "top side", "bottom portion", "bottom side", "top", "bottom", "side" and "below" are merely for ease of description and not intended to indicate the orientation of the sides in which they are specifically configured to be when in use. For example, when in use, the top portion, the portion or any one of the side portions may be disposed upward, downward, frontward or backward.

In the shielded position, the magnet 609 may be disposed at least partially or entirely between the top portion 610a and the bottom portion 610b, so that its magnetic field is substantially restricted within the magnetic shielding element 610. In the engaging position, the magnet 609 may be disposed below the opening 621, and the magnetic field of the magnet 609 may extend at least partially through the opening 621, so that the magnet 609 may magnetically engage a magnetically attractable arrangement (not shown). In FIG. 6, the magnetic arrangement 608 is shown in the engaging position. The arrow denotes the direction of movement of the magnet 609 with respect to the magnetic shielding element 610 when moving to the engaging position. However, in this embodiment, either the magnet 609 or the magnetic shielding element 610 may be configured to move with respect to each other.

The magnetic arrangement 608 may further comprise guide structures 617, which in this embodiment are arranged on the inner surfaces of the side portions 610d of the magnetic shielding element 610. The exemplary guide structures 617 comprise recesses, along which complementary protrusions 622 on the sides of the magnet 609 fit and are configured to slide against. However, other guide structures may also be contemplated. The guide structures 617 may restrict the movement of the magnet 609 with respect to the magnetic shielding element 610 in the vertical direction.

FIG. 7 illustrates an embodiment of a magnetic arrangement 708 which may be included e.g. in the embodiments of an electronic device illustrated in FIGS. 5A to 5C. The magnetic arrangement 708 comprises a magnet 709 and a magnetic shielding element 710. The magnetic shielding element 710 is monolithic and may be substantially box-shaped, and the magnet 709 may be disposed within the magnetic shielding element 710. The magnetic shielding element 710 has a first portion 710a, a second portion 710b, a third portion 710c and side portions 710d. The first portion 710a and third portion 710c are arranged at a top side of the magnetic shielding element 710, the second portion 710b being arranged at the opposite, i.e. bottom side, all three portions being connected to each other by the side portions 710d. The first portion 710a extends along a part of the length of side portions 710d and the third portion 710c along a second part of the side portions 710d, such that there is an opening 721 at the top side between the first portion 710a and the third portion 710c. The second portion 710b also extends along a part of the length of the side portions 710d, so that there is another opening 723 at the bottom side of the magnetic shielding element 710. The openings 721 and 723 are disposed at opposite sides of the magnetic shielding element 710. The magnetic shielding element 710 may be arranged within the first or second portion of the electronic device so that the two openings 721, 723 face opposite main faces of the portion.

Figure 7A:
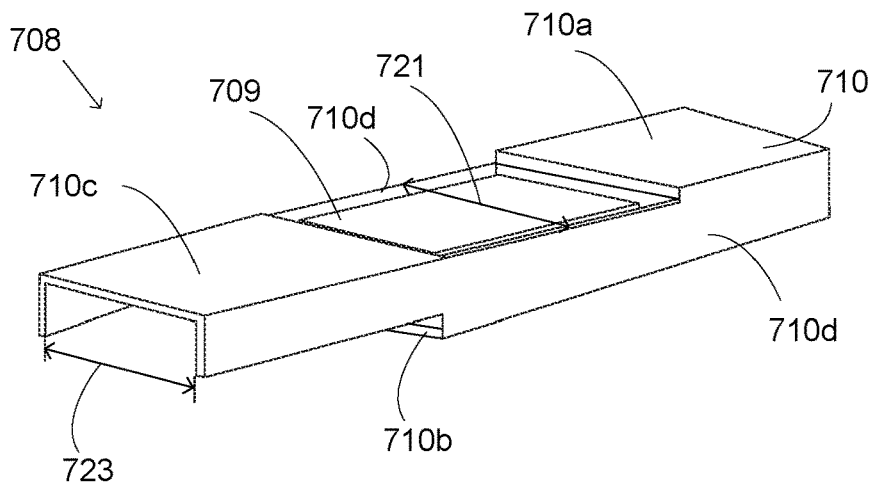
FIGS. 7A and 7B illustrate perspective views of an embodiment of a magnetic arrangement for an electronic device.

In the shielded position, the magnet 709 may be disposed at least partially between the first portion 710a and the second portion 710b, so that its magnetic field is substantially restricted within the magnetic shielding element 710. In a first engaging position, such as the first engaging position illustrated in FIG. 5B, the magnet 709 may be disposed below the opening 721, and the magnetic field of the magnet 709 may extend at least partially through the opening 721, so that the magnet 709 may magnetically engage a magnetically attractable arrangement (not shown). In FIG. 7A, the magnetic arrangement 708 is shown in the first engaging position.

Figure 7B:
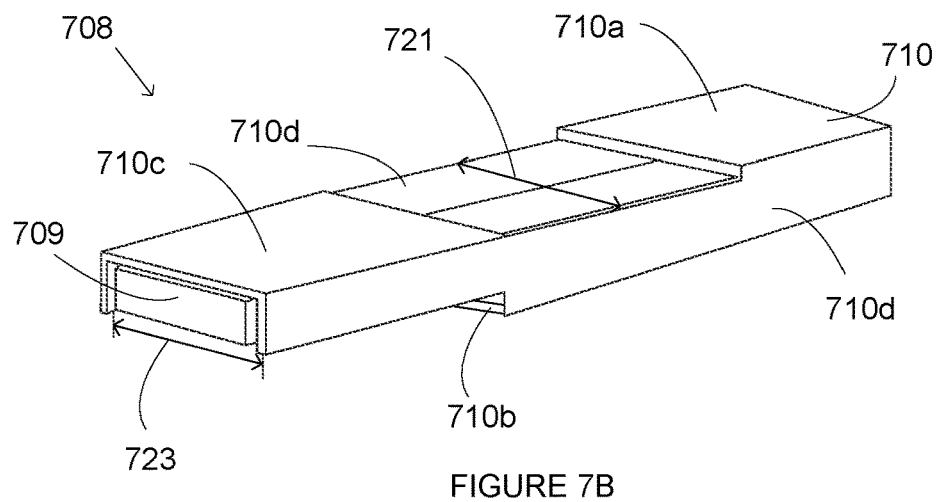

In a second engaging position, such as the second engaging position illustrated in FIG. 5C, the magnet 709 may be disposed above the opening 723, and the magnetic field of the magnet 709 may extend at least partially through the opening 723, so that the magnet 709 may magnetically engage a magnetically attractable arrangement (not shown). In FIG. 7B, the magnetic arrangement 708 is shown in the second engaging position.

Again, in this embodiment, either the magnet 709 or the magnetic shielding element 710 may be configured to move with respect to the other. Although not shown, the magnetic arrangement 708 may be provided with a guide structure, such as the guide structures 617, 622 described in the context of FIG. 6.

Some embodiments are further discussed shortly in the following.

In a first aspect, an electronic device may comprise a first portion and a second portion, the first and second portion being pivotably connected to each other, the electronic device thereby being pivotable between a closed position and a plurality of open positions; a magnetically attractable arrangement disposed within or on the second portion; a magnetic arrangement disposed within or on the first portion, the magnetic arrangement comprising a magnet having a magnetic field and a magnetic shielding element; wherein at least one of the magnet or the magnetic shielding element is configured to move translationally with respect to the other between a shielded position and an engaging position when the first portion is pivoted with respect to the second portion, so that in the closed position of the electronic device, the magnetic arrangement is in the engaging position, and in the open position of the electronic device, the magnetic arrangement is in the shielded position; in the shielded position, the magnetic shielding element at least partially reduces or eliminates a portion of the magnetic field extending outside of the first portion, and in the engaging position, the magnet magnetically engages the magnetically attractable arrangement.

In an embodiment which may be in accordance with the preceding embodiment, the magnetically attractable arrangement is a magnetically attractable element or a second magnetic arrangement.

In an embodiment which may be in accordance with any of the preceding embodiments, the electronic device comprises a guide structure configured to guide the movement of the at least one of the magnet or the magnetic shielding element with respect to the other.

In an embodiment which may be in accordance with any of the preceding embodiments, the magnet is configured to move translationally with respect to the magnetic shielding element between the shielded position and the engaging position.

In an embodiment which may be in accordance with any of the preceding embodiments, the magnetic shielding element is configured to move translationally with respect to the magnet between the shielded position and the engaging position.

In an embodiment which may be in accordance with any of the preceding embodiments, the electronic device comprises an actuator configured to move the at least one of the magnet or the magnetic shielding element with respect to the other.

In an embodiment which may be in accordance with any of the preceding embodiments, the strength of the magnetic field outside of the first portion is configured to be at most 100 mT with the magnetic arrangement being in the shielded position.

In an embodiment which may be in accordance with any of the preceding embodiments, at least one of the magnet or the magnetic shielding element is configured to move translationally with respect to the other in the direction of a main face or of a central axis of the first portion.

In an embodiment which may be in accordance with any of the preceding embodiments, the magnetic arrangement comprises a returning arrangement configured to return the magnetic arrangement to the shielded position.

In an embodiment which may be in accordance with any of the preceding embodiments, the returning arrangement comprises an elastic element or a magnetically attractable element.

In an embodiment which may be in accordance with any of the preceding embodiments, the elastic element is a spring element.

In an embodiment which may be in accordance with any of the preceding embodiments, the electronic device comprises a non-extensible element that is connected to the second portion and to the at least one of the magnet or the magnetic shielding element, the non-extensible element extending between the first portion and the second portion and thereby being configured so that pivoting of the first portion with respect to the second portion causes the motion of the at least one of the magnet or the magnetic shielding element with respect to the other.

In an embodiment which may be in accordance with any of the preceding embodiments, the non-extensible element is fixed with respect to the second portion.

In an embodiment which may be in accordance with any of the preceding embodiments, the first portion has at least two opposite main faces, and the magnet is configured to magnetically engage the magnetically attractable arrangement facing either of the at least two opposite main faces in the closed position.

In an embodiment which may be in accordance with any of the preceding embodiments, the electronic device is pivotable between a first closed position and a second closed position, wherein in the first closed position, the first and second portion are disposed at an angle of 0° or substantially 0° to each other, and in the second closed position, the first and second portion are disposed at an angle of 360° or substantially 360° to each other, the magnet thereby being configured to magnetically engage the magnetically attractable element with the electronic device being in both the first and the second closed position.

In an embodiment which may be in accordance with any of the preceding embodiments, the pivoting of the first portion to an angle of 0° or substantially 0° with respect to the second portion causes the at least one of the magnet or the magnetic shielding element to move a first distance with respect to the other to a first engaging position and pivoting of the first portion to an angle of 360° or substantially 360° with respect to the second portion causes the at least one of the magnet or the magnetic shielding element to move a second distance with respect to the other to a second engaging position, the magnet thereby being configured to magnetically engage the magnetically attractable arrangement in both the first and second engaging position.

In an embodiment which may be in accordance with any of the preceding embodiments, the first portion has at least two opposite main faces; and wherein the magnetic shielding element is configured to restrict the magnetic field of the magnet outside at least one of the at least two opposite main faces with the electronic device being in either one of the first and second closed position.

In an embodiment which may be in accordance with any of the preceding embodiments, the non-extensible element is connected to the second portion asymmetrically with respect to the central axis of the second portion, the non-extensible element being thereby configured so that pivoting of the first portion to an angle of 0° or substantially 0° with respect to the second portion causes the at least one of the magnet or the magnetic shielding element to move a first distance with respect to the other to a first engaging position and pivoting of the first portion to an angle of 360° or substantially 360° with respect to the second portion causes the at least one of the magnet or the magnetic shielding element to move a second distance with respect to the other to a second engaging position, the magnet thereby being configured to magnetically engage the magnetically attractable arrangement in both the first and the second engaging position.

In an embodiment which may be in accordance with any of the preceding embodiments or in a second aspect, the electronic device comprises a first magnetic arrangement disposed within or on the first portion, the first magnetic arrangement comprising a first magnet having a magnetic field and a first magnetic shielding element; a second magnetic arrangement disposed within or on the second portion, the second magnetic arrangement comprising a second magnet having a magnetic field and a second magnetic shielding element; wherein at least one of the first magnet or the first magnetic shielding element is configured to move translationally with respect to the other between a shielded position and an engaging position and at least one of the second magnet or the second magnetic shielding element is configured to move translationally with respect to the other between a shielded position and an engaging position when the first portion is pivoted with respect to the second portion, so that in the closed position of the electronic device, the first and second magnetic arrangements are in the engaging position, and in the open position of the electronic device, the first and second magnetic arrangements are in the shielded position; in the shielded position, the magnetic fields of the first and second magnet are restricted substantially within the first and second portion, respectively, and in the engaging position, the first and second magnet magnetically engage each other.

In an embodiment which may be in accordance with any of the preceding embodiments, the electronic device is pivotable between a first closed position and a second closed position, wherein in the first closed position, the first and second portion are disposed at an angle of 0° or substantially 0° to each other, and in the second closed position, the first and second portion are disposed at an angle of 360° or substantially 360° to each other, the first and second magnet being configured to magnetically engage each other with the electronic device being in either the first or the second closed position.

In an embodiment which may be in accordance with any of the preceding embodiments, the strength of the magnetic fields outside of the first and second portions is configured to be at most 100 mT with the first and second magnetic arrangement being in the shielded position.

In an embodiment which may be in accordance with any of the preceding embodiments, the electronic device comprises a sensor configured to detect at least one of the magnetic fields of the first and second magnet and thereby cause at least one of the first and second magnetic arrangement to move to the engaging position.

In an embodiment which may be in accordance with any of the preceding embodiments, the electronic device comprises guide structures configured to guide the movement of the at least one of the first magnet or the first magnetic shielding element with respect to the other and the movement of the at least one of the second magnet or the second magnetic shielding element with respect to the other.

In an embodiment which may be in accordance with any of the preceding embodiments, the first and second magnets are configured to move translationally with respect to the first and second magnetic shielding elements, respectively, between the shielded position and the engaging position.

In an embodiment which may be in accordance with any of the preceding embodiments, the first and second magnetic shielding elements are configured to move translationally with respect to the first and second magnets, respectively, between the shielded position and the engaging position.

In an embodiment which may be in accordance with any of the preceding embodiments, the electronic device comprises at least one actuator configured to move the at least one of the first magnet or the first magnetic shielding element with respect to the other and the at least one of the second magnet or the second magnetic shielding element with respect to the other.

In an embodiment which may be in accordance with any of the preceding embodiments, the actuator is a non-extensible element according to one or more embodiments described in this specification.

Although some of the present embodiments may be described and illustrated as being implemented in a mobile device, a laptop, or a mobile phone, these are only examples of a device and not a limitation. As those skilled in the art will appreciate, the present embodiments are suitable for application in a variety of different types of devices, such as portable and mobile devices, for example, in tablet computers, game consoles or game controllers, various wearable devices, etc.

The embodiments illustrated and described herein as well as embodiments not specifically described herein but within the scope of aspects of the claims constitute exemplary means for pivoting and/or locking a first and second portion of an electronic device. Pivot elements, hinge regions and hinge elements 103, 203, 303, 403, 503 illustrate exemplary pivoting means for pivoting the first and second portions relative to each other. The magnets 109, 209, 209', 309, 309', 409, 409', 509, 509', 609, 709 illustrate exemplary magnetic means for providing a magnetic field. The magnetic shielding elements 110, 210, 210', 310, 310', 410, 410', 510, 510', 610, 710 constitute exemplary magnetic shielding means for magnetically shielding the magnet(s) and thereby restricting their magnetic field(s). The actuators and non-extensible elements 112, 212, 312, 312', 418, 418', 512, 512' illustrate exemplary means for moving the magnet(s) or the magnetic shielding element(s). The returning arrangements 115, 215, 215', 418, 418', 515, 515' illustrate exemplary means for returning the magnet(s) to the shielded position. The guide structures 317, 317', 417, 417', 617, 622 illustrate exemplary means for guiding the movement of the magnet(s) and/or magnetic shielding element(s). The sensor 420 constitutes exemplary sensing means for detecting the magnetic field(s) of the magnet(s) and optionally for determining an angle between the first and second portion.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

The invention claimed is:

1. An electronic device, comprising
a first portion and a second portion, the first and second portion being pivotably connected to each other, the electronic device thereby being pivotable between a closed position and an open position;
a magnetically attractable arrangement disposed within or on the second portion;
a magnetic arrangement disposed within or on the first portion, the magnetic arrangement comprising a magnet having a magnetic field and a magnetic shielding element;
a first track extending within the first portion and a second track extending within the second portion, the first and second tracks configured to guide a movement of a respective magnetic shielding element between a shielded position and an engaging position;
in the shielded position, the magnetic shielding element decreases a strength of the magnetic field extending outside of the first portion, and
in the engaging position, the magnet magnetically engages the magnetically attractable arrangement.

2. An electronic device as defined in claim 1, wherein the magnetically attractable arrangement is a magnetically attractable element or a second magnetic arrangement.

3. An electronic device as defined in claim 1, wherein the magnet is configured to move translationally with respect to the magnetic shielding element between the shielded position and the engaging position.

4. An electronic device as defined in claim 1, wherein the at least one of the magnet or the magnetic shielding element is configured to move translationally with respect to the other in a direction of a main face or of a central axis of the first portion.

5. An electronic device as defined in claim 1, wherein the electronic device comprises an actuator configured to move the at least one of the magnet or the magnetic shielding element with respect to the other.

6. An electronic device as defined in claim 1, wherein the strength of the magnetic field outside of the first portion is configured to be at most 100 mT with the magnetic arrangement being in the shielded position.

7. An electronic device as defined in claim 1, wherein the magnetic arrangement comprises a returning arrangement configured to return the magnetic arrangement to the shielded position.

8. An electronic device, comprising
   a first portion and a second portion, the first and second portion being pivotably connected to each other, the electronic device thereby being pivotable between a closed position and an open position;
   a magnetically attractable arrangement disposed within or on the second portion;
   a magnetic arrangement disposed within or on the first portion, the magnetic arrangement comprising a magnet having a magnetic field and a magnetic shielding element;
   a track extending within the first portion, the track configured to guide a movement of a the magnetic shielding element between a shielded position and an engaging position so that in the closed position of the electronic device, the magnetic arrangement is in the engaging position, and in the open position of the electronic device, the magnetic arrangement is in the shielded position; and
   in the shielded position, the magnetic shielding element reduces a strength of the magnetic field extending outside of the first portion, and in the engaging position, the magnet magnetically engages the magnetically attractable arrangement.

9. An electronic device as defined in claim 8, wherein the electronic device further comprises a non-extensible element, and wherein the non-extensible element is fixed with respect to the second portion.

10. An electronic device as defined in claim 8, wherein the first portion has at least two opposite main faces, and the magnet is configured to magnetically engage the magnetically attractable arrangement facing either of the at least two opposite main faces in the closed position.

11. An electronic device as defined in claim 8, wherein the electronic device further comprises a non-extensible element that is connected to the second portion and to the at least one of the magnet or the magnetic shielding element, the non-extensible element extending between the first portion and the second portion and thereby being configured so that pivoting of the first portion with respect to the second portion causes a motion of the at least one of the magnet or the magnetic shielding element with respect to the other.

12. An electronic device as defined in claim 11, wherein the electronic device is pivotable between a first closed position and a second closed position, wherein in the first closed position, the first and second portion are disposed at an angle of 0° or substantially 0° to each other, and in the second closed position, the first and second portion are disposed at an angle of 360° or substantially 360° to each other, the magnet thereby being configured to magnetically engage the magnetically attractable arrangement with the electronic device being in both the first and the second closed position.

13. An electronic device as defined in claim 12, wherein the first portion has at least two opposite main faces; and wherein the magnetic shielding element is configured to restrict the magnetic field of the magnet outside at least one of the at least two opposite main faces with the electronic device being in either one of the first and second closed position.

14. An electronic device as defined in claim 8, wherein the electronic device further comprises a non-extensible element, and wherein the non-extensible element is connected to the second portion asymmetrically with respect to a central axis of the second portion, the non-extensible element being thereby configured so that pivoting of the first portion to an angle of 0° or substantially 0° with respect to the second portion causes the at least one of the magnet or the magnetic shielding element to move a first distance with respect to the other to a first engaging position and pivoting of the first portion to an angle of 360° or substantially 360° with respect to the second portion causes the at least one of the magnet or the magnetic shielding element to move a second distance with respect to the other to a second engaging position, the magnet thereby being configured to magnetically engage the magnetically attractable arrangement in both the first and the second engaging position.

15. An electronic device, comprising
   a first portion and a second portion, the first and second portion being pivotably connected to each other, the electronic device thereby being pivotable between a closed position and an open position;
   a first magnetic arrangement disposed within or on the first portion, the first magnetic arrangement comprising a first magnet having a magnetic field and a first magnetic shielding element;
   a second magnetic arrangement disposed within or on the second portion, the second magnetic arrangement comprising a second magnet having a magnetic field and a second magnetic shielding element; and
   a first track extending within the first portion and a second track extending within the second portion, the first and second tracks configured to guide a movement of a respective magnetic shielding element between a shielded position and an engaging position such that in the shielded position, the magnetic fields of the first and second magnet are restricted substantially within the first and second portion, respectively, and in the engaging position, the first and second magnet magnetically engage each other.

16. An electronic device as defined in claim 15, wherein the electronic device is pivotable between a first closed position and a second closed position, wherein in the first closed position, the first and second portion are disposed at an angle of 0° or substantially 0° to each other, and in the second closed position, the first and second portion are disposed at an angle of 360° or substantially 360° to each other, the first and second magnet being configured to magnetically engage each other with the electronic device being in either the first or the second closed position.

17. An electronic device as defined in claim 16, wherein the first portion has at least two opposite main faces; and wherein the first magnetic shielding element is configured to restrict the magnetic field of a magnet outside at least one of the at least two opposite main faces with the electronic device being in either one of the first and second closed position.

18. An electronic device as defined in claim 15, wherein a strength of the magnetic fields outside of the first and second portions is configured to be at most 100 mT with the first and second magnetic arrangement being in the shielded position.

19. An electronic device as defined in claim 15, wherein the electronic device further comprises a sensor configured to detect at least one of the magnetic fields of the first and second magnet and thereby cause at least one of the first and second magnetic arrangement to move to the engaging position.

20. An electronic device as defined in claim 15, wherein the first portion has a first end and a second opposing end, and wherein the first track extends from the first end to the second opposing end.

* * * * *